(12) United States Patent
Green

(10) Patent No.: US 6,909,309 B2
(45) Date of Patent: Jun. 21, 2005

(54) CURRENT-CONTROLLED CMOS CIRCUITS WITH INDUCTIVE BROADBANDING

(75) Inventor: Michael M. Green, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/315,473

(22) Filed: Dec. 9, 2002

(65) Prior Publication Data

US 2003/0122603 A1 Jul. 3, 2003

Related U.S. Application Data

(63) Continuation of application No. 09/965,235, filed on Sep. 26, 2001, now Pat. No. 6,525,571, which is a continuation of application No. 09/610,905, filed on Jul. 6, 2000, now Pat. No. 6,340,899.
(60) Provisional application No. 60/184,703, filed on Feb. 24, 2000.

(51) Int. Cl.[7] .................... H03K 19/094; H03M 9/00
(52) U.S. Cl. .................... 326/115; 326/86; 341/101; 327/407
(58) Field of Search .................... 326/115, 83, 86–88, 326/112, 119, 121; 327/52, 50, 65, 81, 89, 407; 341/100, 101

(56) References Cited

U.S. PATENT DOCUMENTS

| | | |
|---|---|---|
| 4,333,020 A | 6/1982 | Maeder |
| 4,395,774 A | 7/1983 | Rapp |
| 4,449,248 A | 5/1984 | Leslie et al. |
| 4,519,068 A | 5/1985 | Krebs et al. |
| 4,545,023 A | 10/1985 | Mizzi |
| 4,599,526 A | 7/1986 | Paski |
| 4,649,293 A | 3/1987 | Ducourant |
| 4,680,787 A | 7/1987 | Marry |
| 4,727,309 A | 2/1988 | Vajdic et al. |
| 4,731,796 A | 3/1988 | Masterton et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,806,796 A | 2/1989 | Bushey et al. |
| 4,807,282 A | 2/1989 | Kazan et al. |
| 4,817,115 A | 3/1989 | Campo et al. |
| 4,850,009 A | 7/1989 | Zook et al. |

(Continued)

FOREIGN PATENT DOCUMENTS

| | | |
|---|---|---|
| EP | 0 685 933 A1 | 12/1995 |
| EP | 0 685 933 B1 | 12/1995 |
| JP | 63-280517 A | 11/1988 |

OTHER PUBLICATIONS

Buhanan, D. "CML and flip TAB join forces in the DPS 88's Micropackages," *Electronics* Nov. 3, 1982, pp. 93–96.
Chu, K.M. and Pulfrey, D.L. "A comparison of CMOS circuit techniques: Differential cascode voltage switch logic versus conventional logic," *IEEE Journal of Solid–State Circuits* Aug. 1987, pp. 528–532, vol. SC–22, No. 4.

(Continued)

*Primary Examiner*—James H. Cho
(74) *Attorney, Agent, or Firm*—Garlick Harrison & Markison LLP; Shayne X. Short

(57) ABSTRACT

Various circuit techniques for implementing ultra high speed circuits use current-controlled CMOS ($C^3MOS$) logic with inductive broadbanding fabricated in conventional CMOS process technology. Optimum balance between power consumption and speed for each circuit application is achieve by combining high speed $C^3MOS$ logic with inductive broadbanding /$C^3MOS$ logic with low power conventional CMOS logic. The combined $C^3MOS$ logic with inductive broadbanding /$C^3MOS$ /CMOS logic allows greater integration of circuits such as high speed transceivers used in fiber optic communication systems.

20 Claims, 12 Drawing Sheets

U.S. PATENT DOCUMENTS

| | | |
|---|---|---|
| 4,890,832 A | 1/1990 | Zomaki |
| 4,894,792 A | 1/1990 | Mitchell et al. |
| 4,916,441 A | 4/1990 | Gombrich |
| 4,964,121 A | 10/1990 | Moore |
| 4,969,206 A | 11/1990 | Desrochers |
| 4,970,406 A | 11/1990 | Fitzpatrick et al. |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyazaki |
| 5,033,109 A | 7/1991 | Kawano et al. |
| 5,041,740 A | 8/1991 | Smith |
| 5,055,659 A | 10/1991 | Hendrick et al. |
| 5,055,660 A | 10/1991 | Bertagna et al. |
| 5,079,452 A | 1/1992 | Lain et al. |
| 5,081,402 A | 1/1992 | Koleda |
| 5,087,099 A | 2/1992 | Stolarczyk |
| 5,115,151 A | 5/1992 | Hull et al. |
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,177,378 A | 1/1993 | Nagasawa |
| 5,179,721 A | 1/1993 | Comroe et al. |
| 5,181,200 A | 1/1993 | Harrison |
| 5,196,805 A | 3/1993 | Beckwith et al. |
| 5,216,295 A | 6/1993 | Hoang |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,247,656 A | 9/1993 | Kabuo et al. |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mabey et al. |
| 5,289,055 A | 2/1994 | Razavi |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,301,196 A | 4/1994 | Ewen et al. |
| 5,319,369 A * | 6/1994 | Majos et al. ............... 341/101 |
| 5,323,392 A | 6/1994 | Ishii et al. |
| 5,331,509 A | 7/1994 | Kikinis |
| 5,345,449 A | 9/1994 | Buckingham et al. |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,406,615 A | 4/1995 | Miller, II et al. |
| 5,406,643 A | 4/1995 | Burke et al. |
| 5,418,837 A | 5/1995 | Johansson et al. |
| 5,420,529 A | 5/1995 | Guay et al. |
| 5,423,002 A | 6/1995 | Hart |
| 5,426,637 A | 6/1995 | Derby et al. |
| 5,428,636 A | 6/1995 | Meier |
| 5,430,845 A | 7/1995 | Rimmer et al. |
| 5,434,518 A | 7/1995 | Sinh et al. |
| 5,438,329 A | 8/1995 | Gastouniotis et al. |
| 5,457,412 A | 10/1995 | Tamba et al. |
| 5,459,412 A | 10/1995 | Mentzer |
| 5,440,560 A | 11/1995 | Rypinski |
| 5,465,081 A | 11/1995 | Todd |
| 5,481,265 A | 1/1996 | Russell |
| 5,481,562 A | 1/1996 | Pearson et al. |
| 5,510,734 A | 4/1996 | Sone |
| 5,510,748 A | 4/1996 | Erhart et al. |
| 5,521,530 A | 5/1996 | Yao et al. |
| 5,533,029 A | 7/1996 | Gardner |
| 5,535,373 A | 7/1996 | Oinowich |
| 5,544,222 A | 8/1996 | Robinson et al. |
| 5,548,230 A | 8/1996 | Gerson et al. |
| 5,576,644 A | 11/1996 | Pelella |
| 5,579,487 A | 11/1996 | Meyerson et al. |
| 5,584,048 A | 12/1996 | Wieczorek |
| 5,600,267 A | 2/1997 | Wong et al. |
| 5,606,268 A | 2/1997 | Van Brunt |
| 5,625,308 A | 4/1997 | Matsumoto et al. |
| 5,628,055 A | 5/1997 | Stein |
| 5,630,061 A | 5/1997 | Richter et al. |
| 5,640,356 A | 6/1997 | Gibbs |
| 5,675,584 A | 10/1997 | Jeong |
| 5,680,633 A | 10/1997 | Koenck et al. |
| 5,724,361 A | 3/1998 | Fiedler |
| 5,732,346 A | 3/1998 | Lazaridis et al. |
| 5,740,366 A | 4/1998 | Mahany et al. |
| 5,744,366 A | 4/1998 | Kricka et al. |
| 5,767,699 A | 6/1998 | Bosnyak et al. |
| 5,796,727 A | 8/1998 | Harrison et al. |
| 5,798,658 A | 8/1998 | Werking |
| 5,821,809 A | 10/1998 | Boerstler et al. |
| 5,839,051 A | 11/1998 | Grimmett et al. |
| 5,877,642 A | 3/1999 | Takahashi |
| 5,892,382 A | 4/1999 | Ueda et al. |
| 5,903,176 A | 5/1999 | Westgate |
| 5,905,386 A | 5/1999 | Gerson |
| 5,940,771 A | 8/1999 | Gollnick et al. |
| 5,945,847 A | 8/1999 | Ransijn |
| 5,945,858 A | 8/1999 | Sato |
| 5,945,863 A | 8/1999 | Coy |
| 5,969,556 A | 10/1999 | Hayakawa |
| 6,002,279 A | 12/1999 | Evans et al. |
| 6,014,041 A | 1/2000 | Somasekhar et al. |
| 6,014,705 A | 1/2000 | Koenck et al. |
| 6,028,454 A | 2/2000 | Elmasry et al. |
| 6,037,841 A | 3/2000 | Tanji et al. |
| 6,037,842 A | 3/2000 | Bryan et al. |
| 6,038,254 A | 3/2000 | Ferraiolo et al. |
| 6,061,747 A | 5/2000 | Ducaroir et al. |
| 6,081,162 A | 6/2000 | Johnson |
| 6,094,074 A | 7/2000 | Chi et al. |
| 6,104,214 A | 8/2000 | Ueda et al. |
| 6,114,843 A | 9/2000 | Olah |
| 6,188,339 B1 | 2/2001 | Hasegawa |
| 6,194,950 B1 | 2/2001 | Kibar et al. |
| 6,222,380 B1 | 4/2001 | Gerowitz et al. |
| 6,232,844 B1 | 5/2001 | Talaga, Jr. |
| 6,259,312 B1 | 7/2001 | Murtojarvi |
| 6,265,898 B1 | 7/2001 | Bellaouar |
| 6,310,501 B1 | 10/2001 | Yamashita |
| 6,340,899 B1 * | 1/2002 | Green ....................... 326/115 |
| 6,374,311 B1 | 4/2002 | Mahany et al. |
| 6,424,194 B1 | 7/2002 | Hairapetian |
| 6,463,092 B1 | 10/2002 | Kim et al. |

OTHER PUBLICATIONS

Gray, P.R. and Meyer, R.G. "MOS amplifier design," Chapter 12 In Analysis and Design of Analog Integrated Circuits. 1977, John Wiley & Sons, Inc., New York, NY, pp. 704–709.
Harrold, S.J. "Source–coupled FET logic (SCFL) [29]," Chapter 3 In An Introduction to GaAs IC Design. 1993, Prentice Hall International, UK Ltd., Hertfordshire, Great Britain, pp. 43–45, 63, 160.
Heller, L.G. et al. "Cascade voltage switch logic: A differential CMOS logic family," IEEE International Solid–State Circuits Conference Feb. 22, 1984, pp. 16–17.
Hodges, D.A. and Jackson, H.G. "Emitter–coupled logic," Chapter 7 In Analysis and Design of Digital Integrated Circuits. 1983, McGraw Hill, Inc., New York, NY, pp. 271–283.
Katsu, S. et al. "A GaAs monolithic frequency divider using source coupled FET logic," IEEE Electron Device Letters Aug. 1982, pp. 197–199, vol. EDL–3, No. 8.
Katsu, S. et al. "A source coupled FET logic—A new current–mode approach to GaAs logics," IEEE Transactions on Electron Devices Jun. 1985, pp. 1114–1118, vol. ED–32, No. 6.
Lee, T.H. "High–frequency amplifier design," Chapter 8 In The Design of CMOS Radio–Frequency Integrated Circuits. 1998, Cambridge Press, New York, N.Y., pp. 178–185.
Mizuno, M. et al. "A GHz MOS adaptive pipeline technique using MOS current–mode logic," IEEE J. of Solid–State Circuits Jun. 1996, pp. 784–791, vol. 31, No. 6.
Pfennings, L.C.M.G. et al. "Differential split–level CMOS logic for subnanosecond speeds," IEEE Journal of Solid-State Circuits Oct. 1985, pp. 1050–1055, vol. SC–20, No. 5.
Rudell, J.C. et al. "A 1.9–GHz wide–band IF double conversion CMOS receiver for cordless telephone applications," IEEE Journal of Solid State Circuits Dec. 1997, pp. 2071–2088, vol. 32, No. 12.
Somasekhar, D'. and Kaushik, R. "Differential current switch logic a power DCVS logic family," IEEE Journal of Solid–State Circuits Jul. 1996, pp. 981–991, vol. 31, No. 7.
Yamashina, M. et al. "A low–supply voltage GHz MOS integrated circuit for mobile computing systems," IEEE Symposium on Low Power Electronics 1994, pp. 80–81.
Yamashina, M. and Yamada, H. "An MOS current mode logic (MCML) circuit for low–power sub–GHz processors," IEICE Trans. Electron. Oct. 1992, pp. 1181–1187, vol. E75–C, No. 10.
Yamashina, M. and Yamada, H. "An MOS current mode logic (MCML) circuit for low–power sub–GHz processors," NEC Res. Develop. Jan. 1995, pp. 54–63, vol. 36, No. 1.
Bida, A Hybrid Wireless MAC Protocol Supporting Asynchronous and Synchronous MSDU Delivery Services, IEEE 802.11/91–92, Sep. 1991, pp. 1–46.
Robert Meier's Master's Thesis, Mobile Computer Network Architecture, (May 1993), 82 pages.
Hoberecht, A Layered network Protocol for Packet Voice and Data Integration, IEEE Journal on Selected Areas in Communications, vol. SAC–1, No. 6 (Dec. 1983), pp. 1006–1013.
Rypinski, Architecture–Topology and Protocol Stacks, IEEE 802.11/91–21, Mar. 1991, 12 pages.
Cheah, A Proposed Architecture and Access Protocol Outline for the IEEE 802.11 Radio LAN Standards, Document IEEE P802.11/91–54, May 1991; pp. 1–20.

Rypinski, Power–Drain Considerations for Full Time and Sleep Mode Radio Receivers, IEEE P802.11/91–99, Sep. 1991, 11 pages.
Natarajan et al, Battery Efficient Operation of Radio MAC Protocol, IEEE P802.11/91–102, Sep. 1991, pp. 1–5.
Cox, A Radio System Proposal for Widespread Low–Power Tetherless Communications, IEEE Transactions on Communications, vol. 39, No. 2 (Feb. 1991), pp. 324–335.
Bagby, One Approach to Wireless Network Architecture, IEEE P802.11/91–2, Jan. 1991, 1–15, 17–21.
Biba, A Modest Proposal for a Asynchronous, Data Intensive, Wireless Local Area Network, IEEE P802.11/91–25, Mar. 1991; pp. 1–25.
Heimschi et al; Merged CMOS/Bipolar Current Switch Logic (MCSL), IEEE Journal of Solid State Circuits, vol.24, pp. 1307–11, Oct. 1989, pp. 1307–1311.
Elrabaa et al; Optimization of Digital BiCMOS Circuits, An Overview, IEEE 1992, 5 pages.
Mudd et al, Very High Speed ECL/CMG Gate Arrays with Submicron Structures; IEEE 1989, 5 pages.
Atkinson, A Single Chip Radio Transceiver for DECT, IEEE 1997.
Mizuno, A GHzMOS Adaptive Pipeline Technique Using MOS Curren–Mode Logic, IEEE Journal of Solid–State Circuits, vol. 31, No. 6, pp. 784–791 (Jun. 1996).
Klose, Process–Optimization for Sub–3Ops BiCMOS Technologies for Mixed ECL/CMOS Applications, IEEE 1991.
Heimsch, Merged CMOS/Bipolar Current Switch Logic (MCSL), IEEE Journal of Solid–State Circuits, vol. 24, No. 5, pp. 1307–1311 (Oct. 1989).
Elrabaa, Optimization of Digital BiCMOS Circuit, An Overview, IEEE 1992.
Elrabaa, Multimitter BiCMOS CML Circuits, IEEE Journal of Solid–State Circuits, vol. 27, No. 3, pp. 454–458 (Mar. 1992).
Ewen et al., Single–Chip 1062Mbaud CMOS Transceiver for Serial Data Communication, 1995 IEEE International Solid–State Circuits Conference Digest of Technical Papers, pp. 32–33, 336.
Chen and Waldron, A Single–Chip 266Mb/s CMOS Transmitter/Receiver for Serial Data Communications, 1993 IEEE International Solid–State Circuits Conference Digest of Technical Papers, pp. 100–101, 269.
Oshima et al., A Single CMOS SDH Terminal Chip for 622 Mb/s STM 4C, 1994 IEEE International Solid–State Circuits Conference Digest of Technical Papers, pp. 174–175.
Widmer et al., Single–Chip 4x500Mbaud CMOS Transceiver, 1996 IEEE International Solid–State Circuits Conference Digest of Technical Papers, pp. 126–127, 430.
Lee et al., A CMOS Serial Link for 1 Gbaud Fully Duplexed Data Communication, 1994 Symposium on VLSI Circuits Digest of Technical Papers, pp. 125–126.
Lee et al., A CMOS Serial Link for Fully Duplexed Data Communication, IEEE Journal of Solid–State Circuits, vol. 30, pp. 353–364 (Apr. 1995).
Djahanshahi et al., High–speed ECL–Compatible Serial 1/0 in $0.35\mu m$ CMOS, IEEE 1998.
Fukaishi et al., A 4.25–Gb/s CMOS Fiber Channel Transceiver with Asynchronous Tree–Type Demultiplexer and Frequency Conversion Architecture, IEEE Journal of Solid–state Circuits, vol. 33 No. 12, pp. 2139–2147 (1998).
Madhavan and Levi, Low–Power 2.5 Gbit/s VCSEL driver in $0.5\mu m$ CMOS technology, Electronics Letters, vol. 34 No. 2 pp. 178–179 (Jan. 1998).

Chen and Baker, A 1.25Gb/s, 460mW CMOS Transceiver for Serial Data Communication, 1997 IEEE International Solid–state Circuits Conference pp. 242–243, 465.

Runge and Thomas, 5Gbit/s 2:1 multiplexer fabricated in 0.35µm CMOS and 3Gbit/s 1:2 demultiplexer fabricated in 0.5µm CMOS technology, Electronics Letters, vol. 35 No. 19.pp. 163 1–33 (Sep. 1999).

Fiedler et al., A 1.0625Gbps Transceiver with 2x–Oversampling and Transmit Signal Pre–Emphasis, 1997 IEEE International Solid–state Circuits Conference pp. 238–239, 464.

Widmer et al., Single–Chip 4 x 500–MEd CMOS Transceiver, IEEE Journal of Solid–state Circuits, vol. 31 No. 12 pp. 2004–2014 (1996).

Kurisu et al., 2.8Gb/s 176mW Byte–Interleaved and 3.0 Gb/s 118mW Bit–Interleaved 8:1 Multiplexers, 1996 International Solid state Circuits Conference pp. 122–123, 429.

Friedman et al, A Baseband Processor for IS–54 Cellular Telephony, IEEE Journal of Solid–state Circuits, vol. 31 No. 5 pp. 646–655 (May 1996).

Ewen et al., CMOS circuits for Gb/s serial data communication, IBM J. Res. Develop., vol. 39 No. 12 pp. 73–81 (Mar. 1995).

Thompson et al., A 300–MHz BiCMOS Serial Data Transceiver, IEEE Journal of Solid–state Circuits, vol. 29 No. 3 pp. 185–192 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbit/s Bandwidth MultiplexerfDemultiplexer CMOS Chip, 1992 Symposium on VLSI Circuits Digest of Technical Papers pp. 68–69.

Navarro and Van Noije, Design of an 8:1 MUX at 1.7Gbit/s in 0.8µm CMOS Technology, 1998 Great Lakes Symposium on VLSI.

Pederson and Metz, A CMOS to 100K ECL Interface Circuit, 1989 IEEE International Solid–state Circuits Conference pp. 226–227, 345.

Baumert et al., A Monolithic 50–200 MHz CMOS Clock Recovery and Retiming Circuit, IEEE 1989 Custom Integrated Circuits Conference pp. 14.5.1–14.5.4. (May 1989).

* cited by examiner

CURRENT-CONTROLLED CMOS CIRCUITS WITH INDUCTIVE BROADBANDING

CROSS-REFERENCES TO RELATED APPLICATIONS

This application is a continuation of and claims the benefit of U.S. provisional patent application No. 60/184,703, filed Feb. 24, 2000, the disclosure of which is incorporated herein by reference.

BACKGROUND OF THE INVENTION

The present invention relates in general to high speed logic circuitry, and in particular to current-controlled CMOS (or $C^3MOS$™) logic circuits with inductive broadbanding.

For a number of reasons CMOS is the logic family of choice in today's VLSI devices. Due to the complementary nature of its operation, CMOS logic consumes zero static power. CMOS also readily scales with technology. These two features are highly desirable given the drastic growth in demand for low power and portable electronic devices. Further, with the computer aided design (CAD) industry's focus on developing automated design tools for CMOS based technologies, the cost and the development time of CMOS VLSI devices has reduced significantly.

The one drawback of the CMOS logic family, however, remains its limited speed. That is, conventional CMOS logic has not achieved the highest attainable switching speeds made possible by modern sub-micron CMOS technologies. As a result of the speed limitations of conventional CMOS logic, integrated circuit applications in the Giga Hertz frequency range have had to look to alternative technologies such as ultra high speed bipolar circuits and Gallium Arsenide (GaAs). These alternative technologies, however, have drawbacks of their own that have made them more of a specialized field with limited applications as compared to silicon MOSFET that has had widespread use and support by the industry. In particular, compound semiconductors such as GaAs are more susceptible to defects that degrade device performance, and suffer from increased gate leakage current and reduced noise margins. Furthermore, attempts to reliably fabricate a high quality oxide layer using GaAs have not thus far met with success. This has made it difficult to fabricate GaAs FETs, limiting the GaAs technology to junction field-effect transistors (JFETs) or Schottky barrier metal semiconductor field-effect transistors (MESFETs). A major drawback of the bipolar technology, among others, is its higher current dissipation even for circuits that operate at lower frequencies.

SUMMARY OF THE INVENTION

A significant improvement in speed of operation of CMOS circuitry has been achieved by a family of CMOS logic that is based on current-controlled mechanism. Current-controlled CMOS (or $C^3MOS$) logic is described in greater detail in commonly-assigned patent application Ser. No. 09/484,856, entitled "Current-Controlled CMOS Logic Family," by Hairapetian, which is hereby incorporated in its entirety for all purposes. The basic building block of the $C^3MOS$ logic family uses a pair of conventional MOSFETs that steer current between a pair of load devices in response to a difference between a pair of input signals. Thus, unlike conventional CMOS logic, $C^3MOS$ logic dissipates static current, but operates at much higher speeds.

According to one aspect of the invention, to further enhance speed of operation of circuits implemented in CMOS technology, the present invention introduces inductive elements in the $C^3MOS$ circuits. In a specific embodiment, a spiral inductor is inserted in series with the load devices of selected $C^3MOS$ structures that process high-bandwidth data signals. The resulting series combination of inductor and resistive element (e.g., polysilicon resistors) that is in parallel with an existing capacitive load provides a high impedance at a higher bandwidth than would be possible without the presence of the inductor. Optimized values for the inductors ensure appropriate placement of the circuit's natural frequencies in the complex plane to achieve fast rise and fall times with appropriate overshoot and undershoot. The present invention combines the use of this type of shunt peaking with $C^3MOS$ circuits that process broadband bi-level (i.e., digital as opposed to analog) differential signals. The combination of these characteristics allows for improvement of the output signal's inter-symbol interference without any increase in power dissipation.

According to another aspect of the invention, a multiplexer circuit includes $C^3MOS$ with inductive broadbanding to facilitate operation at ultra-high frequencies.

According to another aspect of the invention, a flip-flop is implemented utilizing $C^3MOS$ with inductive broadbanding to operate at ultrahigh frequencies.

According to another aspect of the invention, a complementary metal-oxide-semiconductor (CMOS) logic circuitry combines on the same silicon substrate, current-controlled MOSFET circuitry of the type described above for high speed signal processing, with conventional CMOS logic that does not dissipate static current. Examples of such combined circuitry include serializer/deserializer circuitry used in high speed serial links, high speed phase-locked loop dividers, and the like.

Other features and advantages of the invention will be apparent in view of the following detailed description and appended drawings.

DESCRIPTION OF THE SPECIFIC EMBODIMENTS

The present invention provides ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. The present invention uses current-controlled mechanisms with inductive broadbanding to develop a family of very fast current-controlled CMOS (or C³MOS™) with inductive broadbanding logic that can be fabricated using a variety of conventional CMOS process technologies, but that unlike conventional CMOS logic does dissipate static current. C³MOS with inductive broadbanding logic or current-controlled metal-oxide-semiconductor field-effect transistor (MOSFET) logic are used herein interchangeably.

In a preferred embodiment, the basic building block of this logic family is an NMOS differential pair with series connected inductive/resistive (LR) loads.

Figure 1:
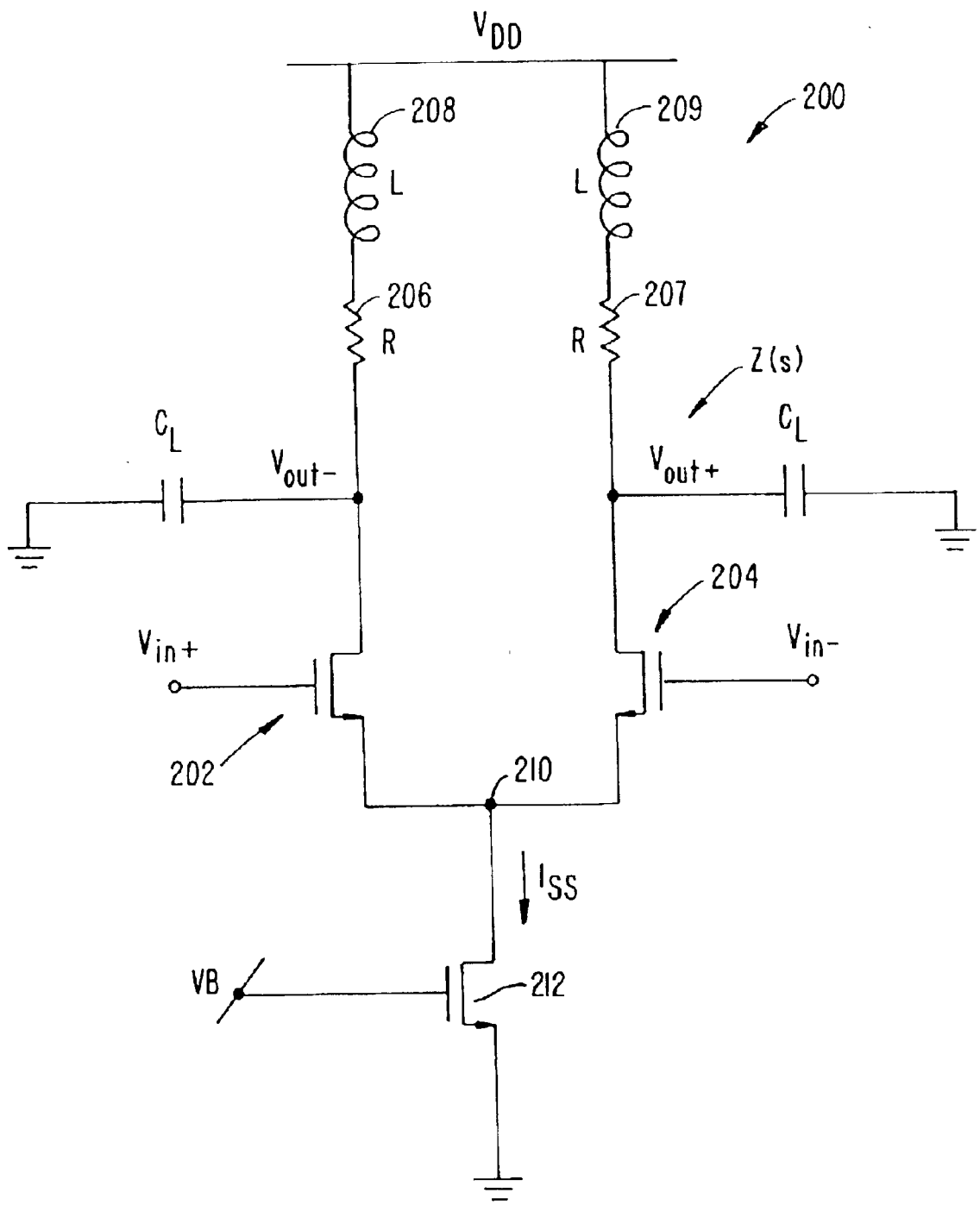
FIG. 1 is a schematic diagram of differential pair including inductive broadbanding implemented with CMOS technology.

FIG. 1 illustrates the basic C³MOS differential pair 200 with shunt inductors L, and load capacitors $C_L$. A pair of n-channel MOSFETs 202 and 204 receive differential logic signals $V_{in}+$ and $V_{in}-$ at their gate terminals, respectively. Resistive loads 206 and 207 in series with shunt inductors 208 and 209 connect the drain terminals of MOSFETs 202 and 204, respectively, to the power supply VDD. Drain terminals of MOSFETs 202 and 204 form the outputs $V_{out}-$ and $V_{out}+$ of the differential pair, respectively. In a preferred embodiment, the shunt inductors 208 and 209 are spiral inductors coupled to the substrate utilizing standard techniques. Resistive loads 206 and 207 may be made up of either p-channel MOSFETs operating in their linear region, or resistors made up of, for example, polysilicon material. In a preferred embodiment, polysilicon resistors are used to implement resistive loads 206 and 207, which maximizes the speed of differential pair 200. The source terminals of n-channel MOSFETs 202 and 204 connect together at node 210. A current-source n-channel MOSFET 212 connects node 210 to ground (or negative power supply). A bias voltage VB drives the gate terminal of current-source MOSFET 212 and sets up the amount of current I that flows through differential pair 200. In response to the differential signal at $V_{in}+$ and $V_{in}-$, one of the two input n-channel MOSFETs 202 and 204 switches on while the other switches off. All of current I, thus flows in one leg of the differential pair pulling the drain terminal ($V_{out}+$ or $V_{out}-$) of the on transistor down to logic low, while the drain of the other (off) transistor is pulled up toward logic high. Shunt peaking, according to the present invention, can be selectively applied to those parts of an integrated circuit that require the bandwidth enhancement.

In FIG. 1, the input levels $V_{in}+$ and $V_{in}-$ vary symmetrically in opposite directions when a digital signal is received. For example if $V_{in}+$ swung positive then $V_{in}-$ would swing negative. The voltage levels at $V_{out}-$ and $V_{out}+$ swing in the same direction as the respective input signal levels. For reasons described more fully below, for broadband signals including frequencies in the range of over 5 GigaHz the transient response of the circuit must be fast.

Figure 2A:
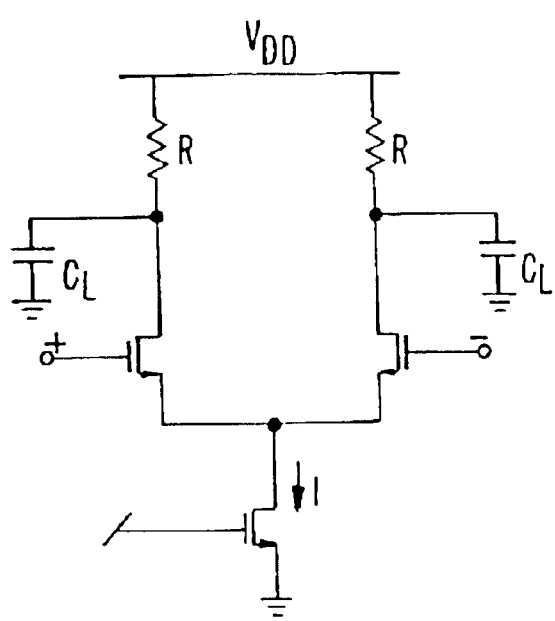
FIG. 2(a) is a schematic diagram of the circuit of FIG. 1 without the shunt inductor.
Figure 2B:
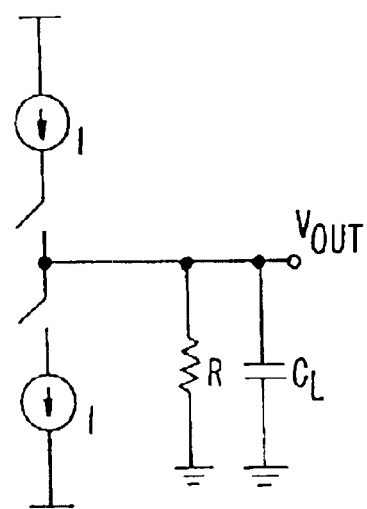
FIG. 2(b) is a simplified diagram depicting the transient behavior of the circuit of FIG. 2(a)
Figure 2C:
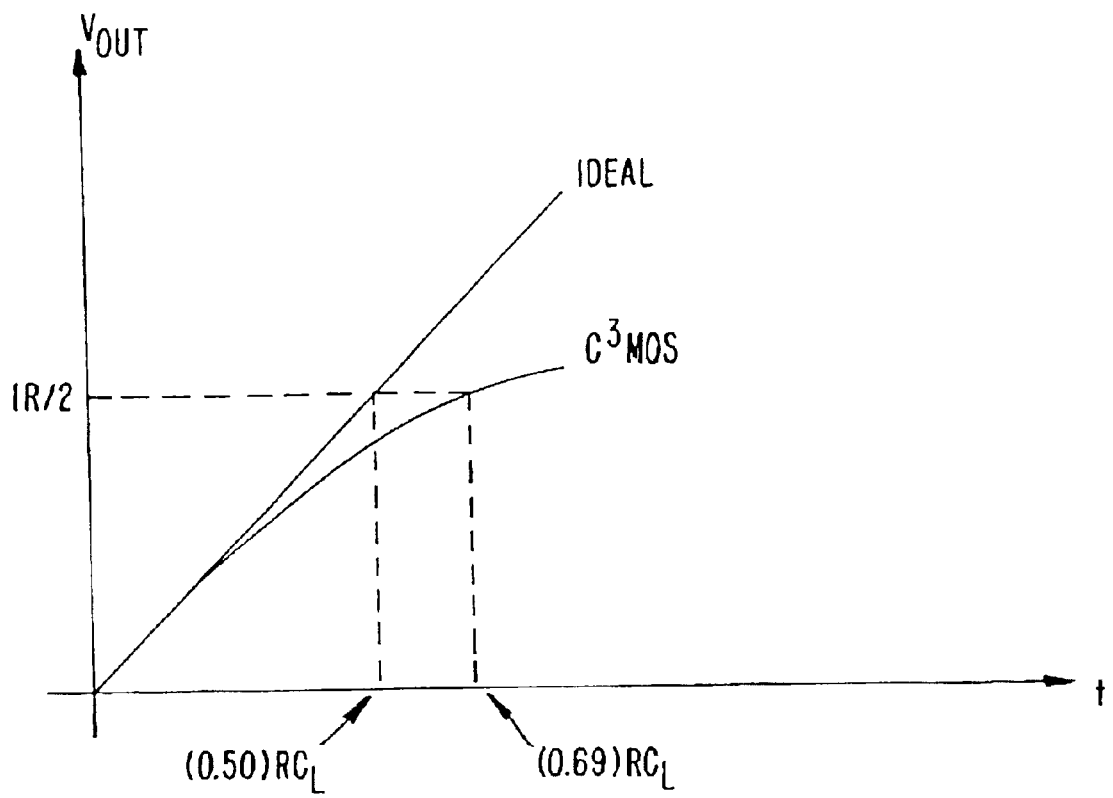
FIG. 2(c) is a graph depicting the difference between ideal and $C^3MOS$ step responses.

FIGS. 2(a) and (b) respectively depict the circuit of FIG. 1 with the inductors removed, resulting in a C³MOS buffer, and a simple equivalent circuit illustrating the transient behavior of the circuit. In this case the output transient waveform is characterized by an exponential waveform with a time constant RC. This waveform is depicted in FIG. 2(c) with a label "C³MOS" and has an initial slope of $I/C_L$. The difference between the ideal and exponential step response is also depicted in FIG. 2(c).

In the circuit of FIG. 2(a) the transient response of the output signal would be controlled by the RC time constant. It is clear from FIG. 2(c) that the presence of the load resistor significantly slows down the transient step response. Thus, when an input signal is received with a very fast rise time the current increases rapidly to charge or discharge the load capacitor. However, the transient response of the output signal is controlled by the RC time constant and can have a longer rise time than the input pulse.

Now, considering the circuit as disclosed in FIG. 1, including the inductors, as is well-known in the art an inductor resists a change in current. Thus, when the drain current changes in response to an input signal the inductor chokes off current flow through the resistor so that the capacitor discharges rapidly to generate an output signal with a small rise time.

Figure 3:
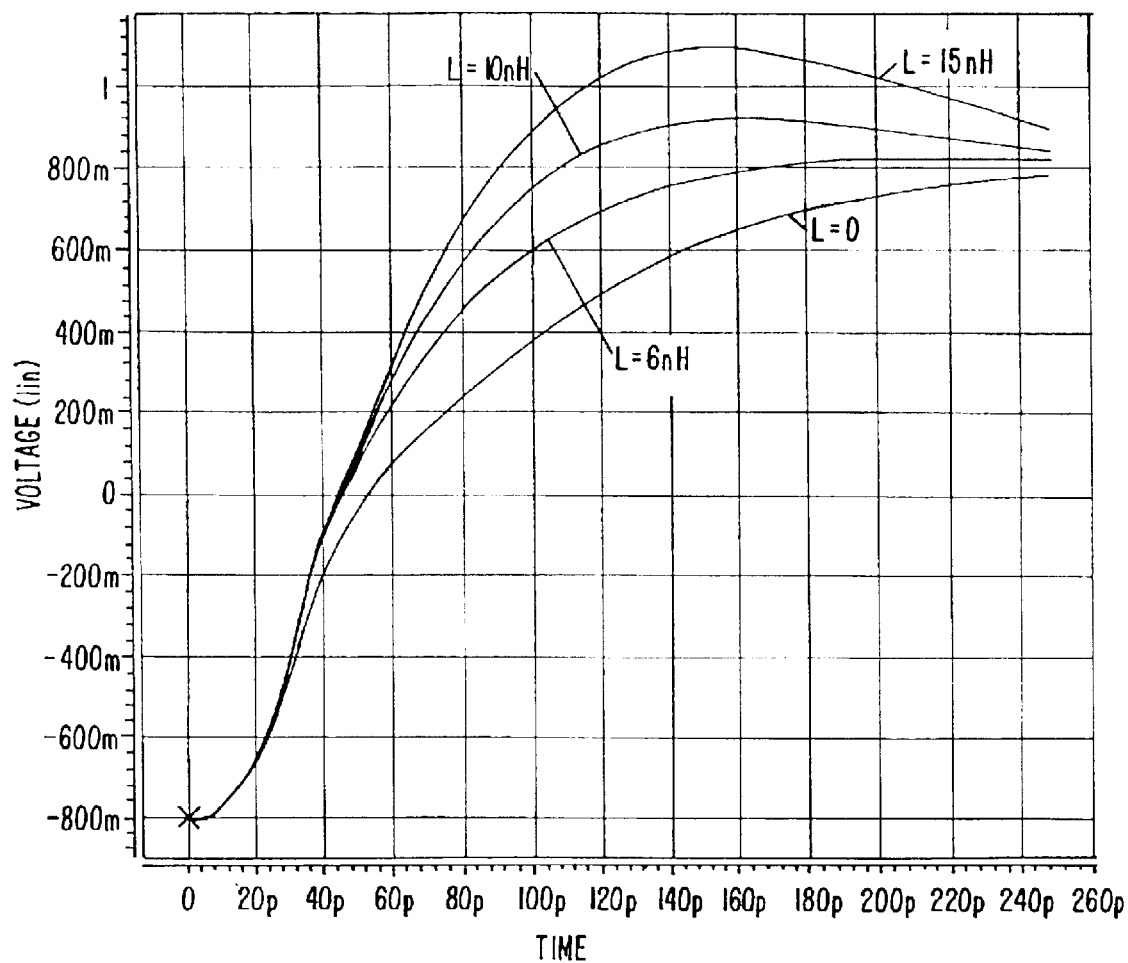
FIG. 3 is a graph depicting the step response of the circuit of FIG. 1 for four values of series inductance.

The larger the value of series inductance, the longer the full value of the current is available to charge/discharge the load capacitances. FIG. 3 shows the step response for 4 different values of series inductance.

From FIG. 3 it is clear that higher values of inductance decrease the rise time. However, if the inductance value becomes too large, an excessive overshoot will occur. To determine the optimum value of inductance, the pulse response for a set of input pulses is observed with varying pulse widths. The graphs in FIG. 4(a) show the relative error between output and input pulse widths (referred to as intersymbol interference or ISI) for 4 values of inductance.

Figure 4A:
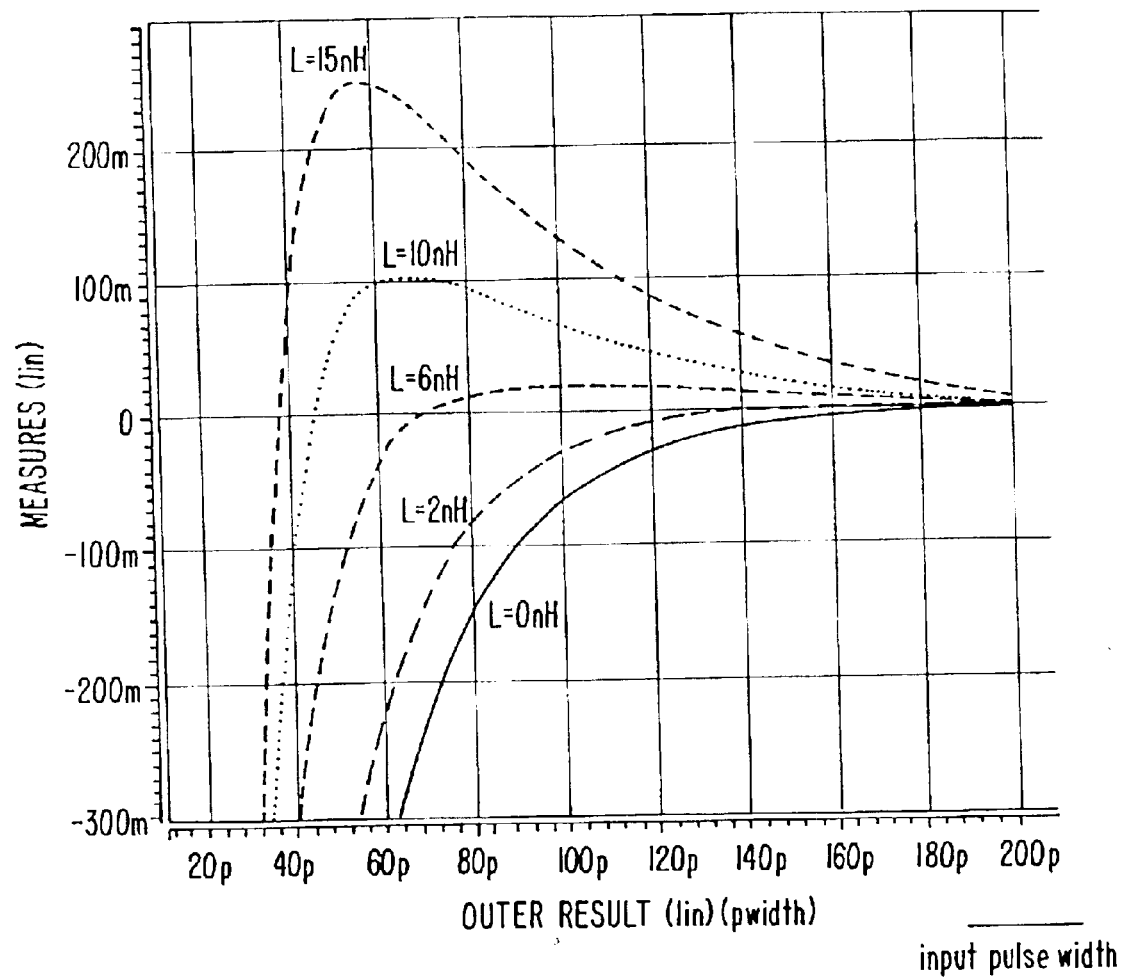
FIG. 4(a) is a graph depicting inter-symbol interference (ISI) vs. input pulse width for five values of series inductance.

From the FIG. 4(a) graphs it is apparent that given the values of R and $C_L$, the optimum inductor value is given by:

$$L_{S(opt)}=(0.35)*C_L R^2$$

Figure 4B:
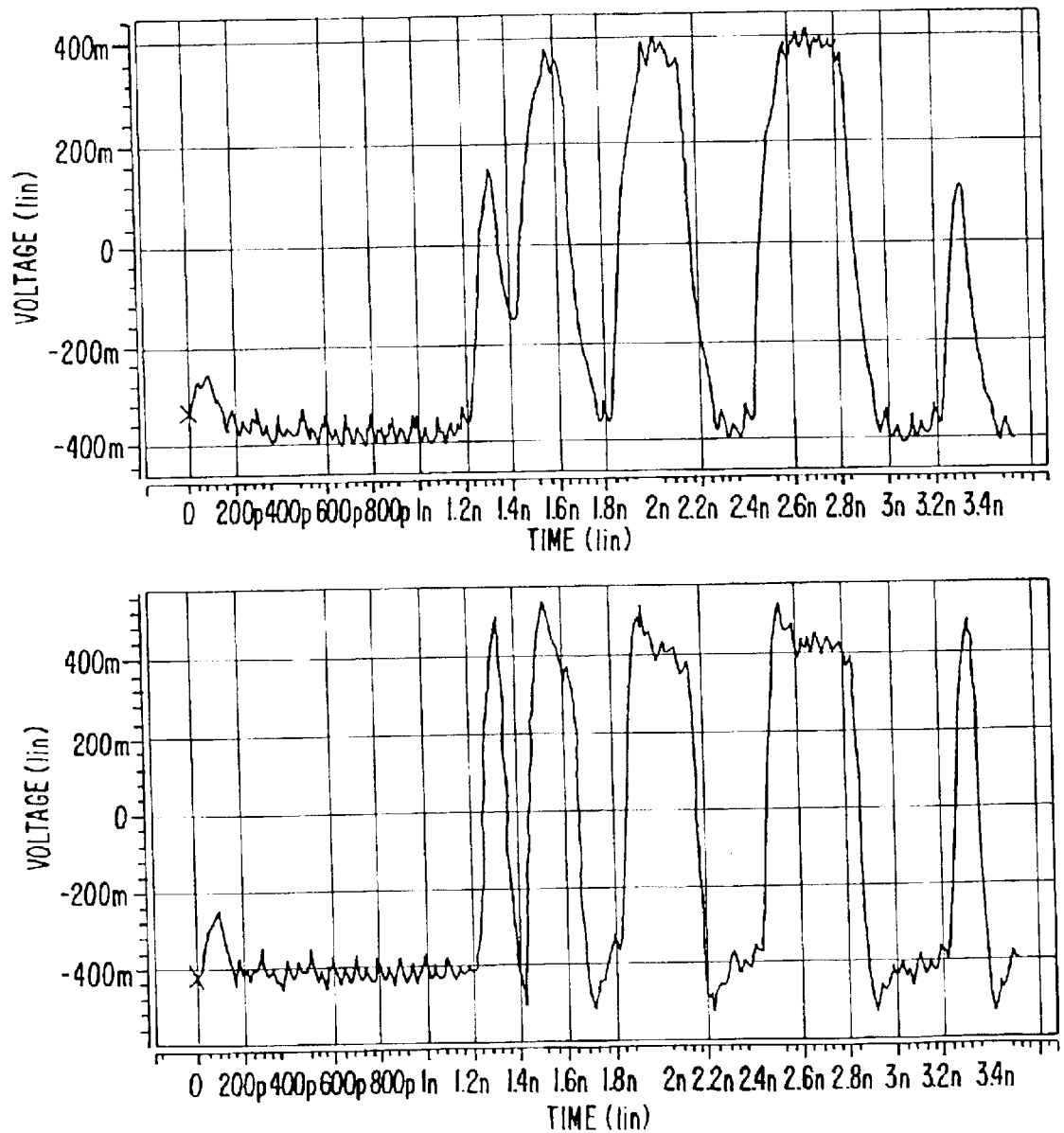
FIG. 4(b) is a graph depicting the output signal of the circuit of FIG. 1 with and without inductors.

FIG. 4(b) depicts the output signals for the circuit of FIG. 1 with and without the inductors. The magnitude of the time intervals between zero crossing points of the output signal provide important information for interpreting the input signal. As depicted in FIG. 4(b), the slope of the waveform zero-crossings is sharper when the inductors are included in the circuit thereby more precisely defining the time intervals between zero-crossing points and reducing inter-symbol interference.

In one embodiment of the present invention a transceiver circuit along a fiber optic channel deserializes an input data stream with a bit rate of, for example, 10 Gb/s. After processing the lower frequency deserialized data, the data is serialized before transmission back onto the fiber channel.

According to the present invention, those parts of this circuitry that process the highest speed data (e.g., input to the deserializer and output of the serializer) are implemented by C³MOS circuitry with inductive broadbanding.

Figure 5:
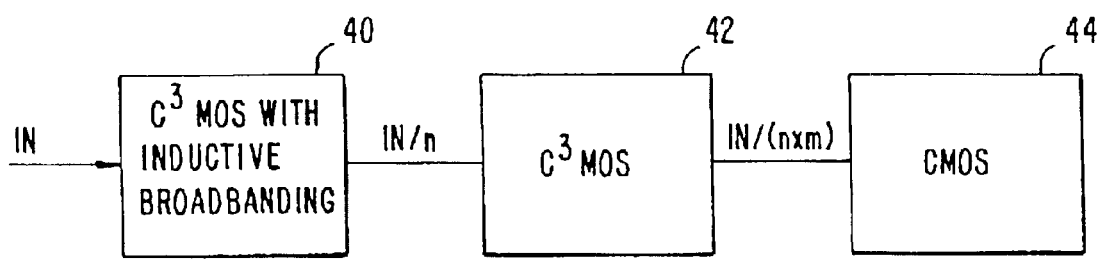
FIG. 5 is shows a block diagram for a circuit that combines $C^3MOS$ with inductive broadbanding, $C^3MOS$, and conventional CMOS logic on a single silicon substrate to achieve optimum tradeoff between speed and power consumption.

FIG. 5 shows a simplified block diagram illustrating this exemplary embodiment of the invention. A C³MOS with inductive broadbanding input circuit 40 receives a high frequency input signal IN and outputs a first divided down version of the signal IN/n. A C³MOS MUX 42 then receives this first divided down version and divides the received signal down by another factor of m to output a second divided down version of the signal IN/(n×m). The lower frequency signal IN/(n×m) is then processes by core circuitry 44 that is implemented in conventional CMOS logic. The low frequency signal from the core logic is then increased in frequency by the reverse process to form an output signal at the original high input frequency.

Figure 6A:
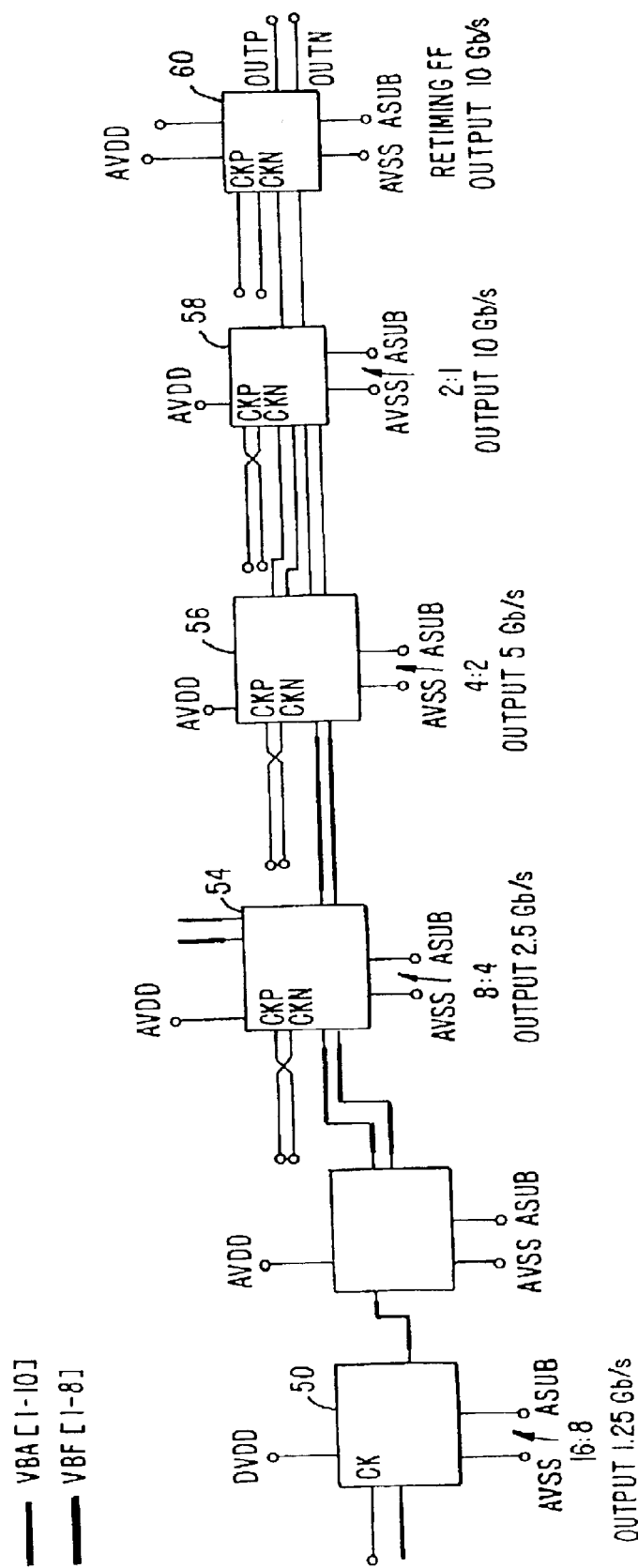
FIG. 6(a) is a schematic diagram of a serializer circuit utilizing features of the invention.

FIG. 6(a) shows an exemplary 16:1 serializer according to the present invention. The serializer includes a 16:8 multiplexer 50 that converts the data rate to 1.25 Gb/s, followed by an 8:4 multiplexer 54 that converts the data rate to 2.5 Gb/s. The 2.5 Gb/s data is further converted to a 5 Gb/s data by a 4:2 multiplexer 56, and finally to a 10 Gb/s data by a 2:1 multiplexer 58. A flip flop 60 at the output re-times the 10 Gb/s data to generate the final output data stream.

According to this embodiment of the invention, the circuit of FIG. 6(a) may combine conventional CMOS logic used for the lower speed multiplexers and core processing circuitry, with C³MOS logic for the mid-rate multiplexers, and C³MOS logic with inductive broadbanding for the highest speed multiplexer (i.e., the 2:1 multiplexer 58) as well as the output re-timing flip flop 60.

As illustrated by the various C³MOS with inductive broadbanding logic elements described below, all of the building blocks of any logic circuitry can be constructed using the C³MOS with inductive broadbanding technique of the present invention. More complex logic circuits such as shift registers, counters, frequency dividers, etc., can be constructed in C³MOS with inductive broadbanding using the basic elements described above. As mentioned above, however, both C³MOS and C³MOS with inductive broadbanding logic does consume static power. Additionally, the fabrication of C³MOS with inductive broadbanding logic is more expensive than C³MOS or CMOS because of the need to add inductors to the IC.

The static current dissipation of C³MOS and/or C³MOS with inductive broadbanding may become a limiting factor in certain large scale circuit applications. In one embodiment, as depicted for example in FIGS. 5 and 6(a), the present invention combines C³MOS with inductive broadbanding and C³MOS logic with conventional CMOS logic to achieve an optimum balance between speed and power consumption. According to this embodiment of the present invention, an integrated circuit utilizes C³MOS with inductive broadbanding logic for the ultra high speed (e.g., 10 Gb/s) portions of the circuitry, C³MOS for very high speed parts of the circuit (e.g., 2.5–5 Gb/s), and conventional CMOS logic for the relatively lower speed sections. For example, to enable an integrated circuit to be used in ultra high speed applications, the input and output circuitry that interfaces with and processes the high speed signals is implemented using C³MOS with inductive broadbanding. The circuit also employs C³MOS to divide down the frequency of the signals being processed to a low enough frequency where conventional CMOS logic can be used. The core of the circuit, according to this embodiment, is therefore implemented by conventional CMOS logic that consumes zero static current.

Figure 6B:
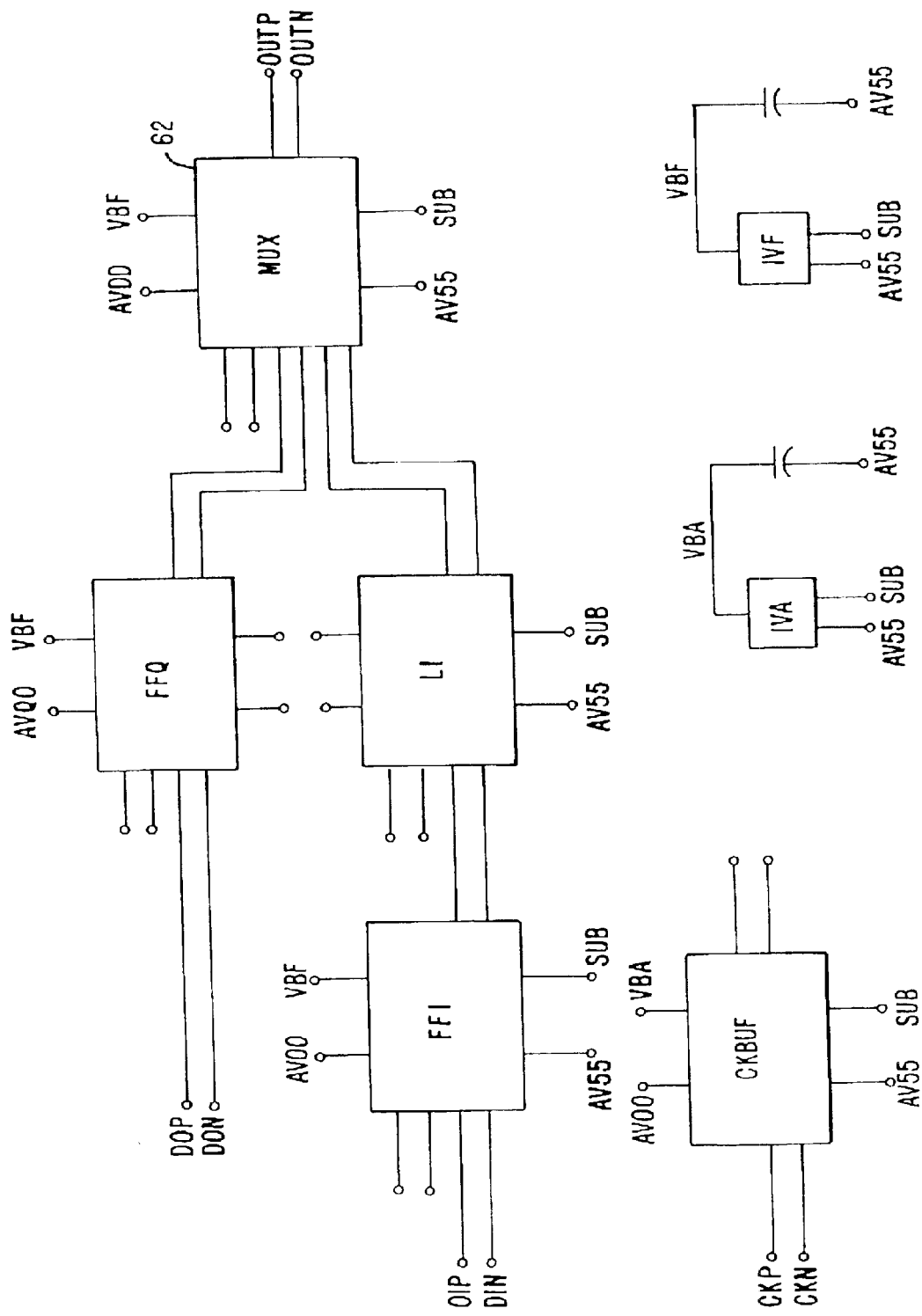
FIG. 6(b) is a more detailed depiction of the 2:1 MUX depicted in FIG. 6(a)
Figure 7:
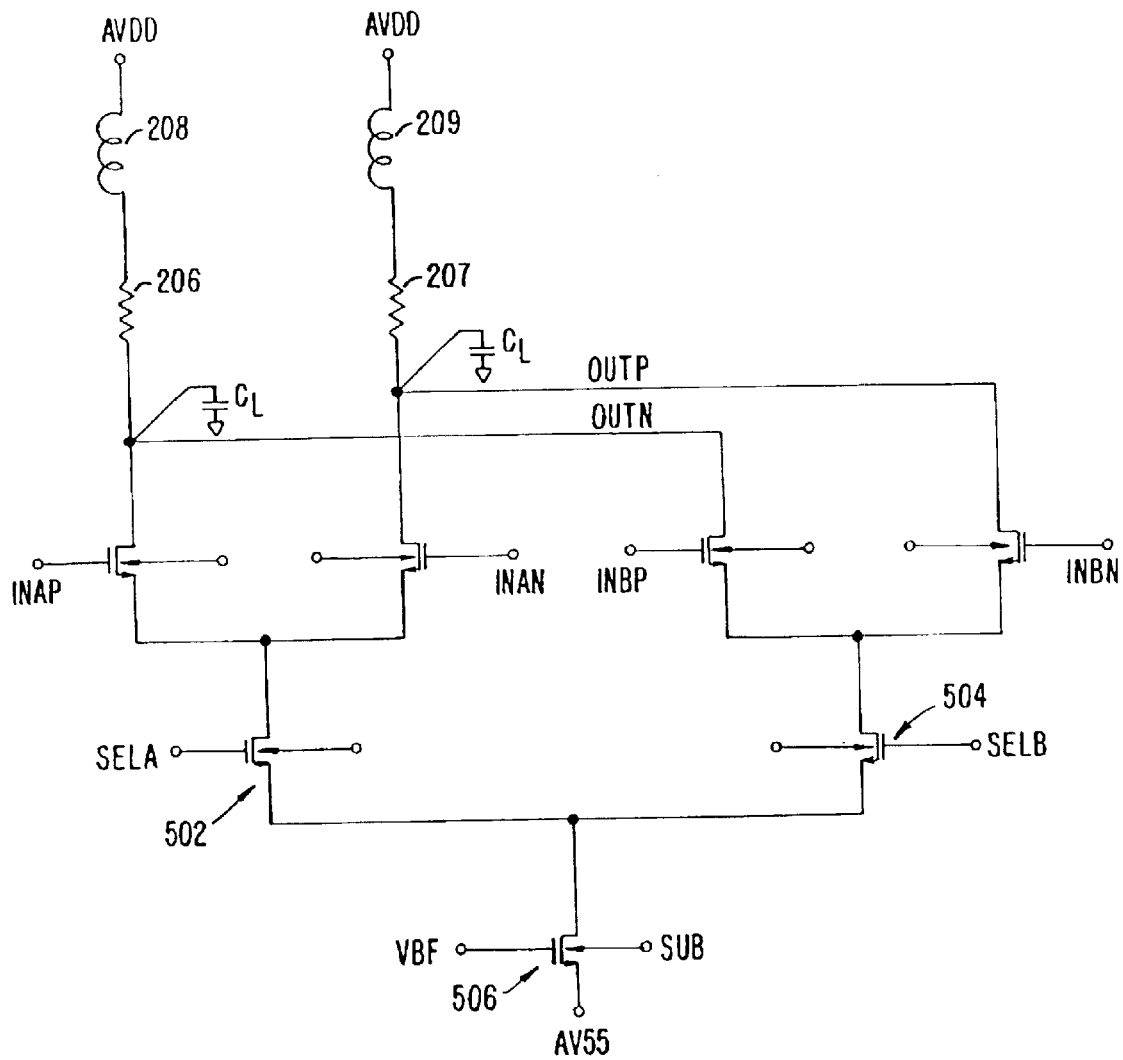
FIG. 7 is a circuit diagram of a MUX utilizing features of the present invention.

FIG. 6(b) shows an implementation of the 2:1 multiplexer 58 wherein the actual output multiplexing circuit 62 uses C³MOS with inductive broadbanding an implementation of which is shown in FIG. 7.

FIG. 7 shows an exemplary C³MOS with inductive broadbanding implementation for a 2:1 multiplexer 62. Similar to the other C³MOS logic gates, multiplexer 62 includes a differential pair for each input. The positive (left) input transistor of each differential pair is coupled to VDD through by a first resistor 206 connected in series with a first series inductor 208 and the negative (right) input transistor of each differential pair is coupled to VDD through by a second resistor 207 connected in series with a second series inductor 209. The multiplexer 62 further includes select transistors 502 and 504 inserted between the common source terminals of the differential pairs and the current source transistor 506. By asserting one of the select input signals SELA or SELB, the bias current is steered to the differential pair associated with that select transistor. Thus, signal SELA steers the bias current to the differential pair with AP and AN inputs, and signal SELB steers the bias current to the differential pair with BP and BN inputs.

Figure 8:
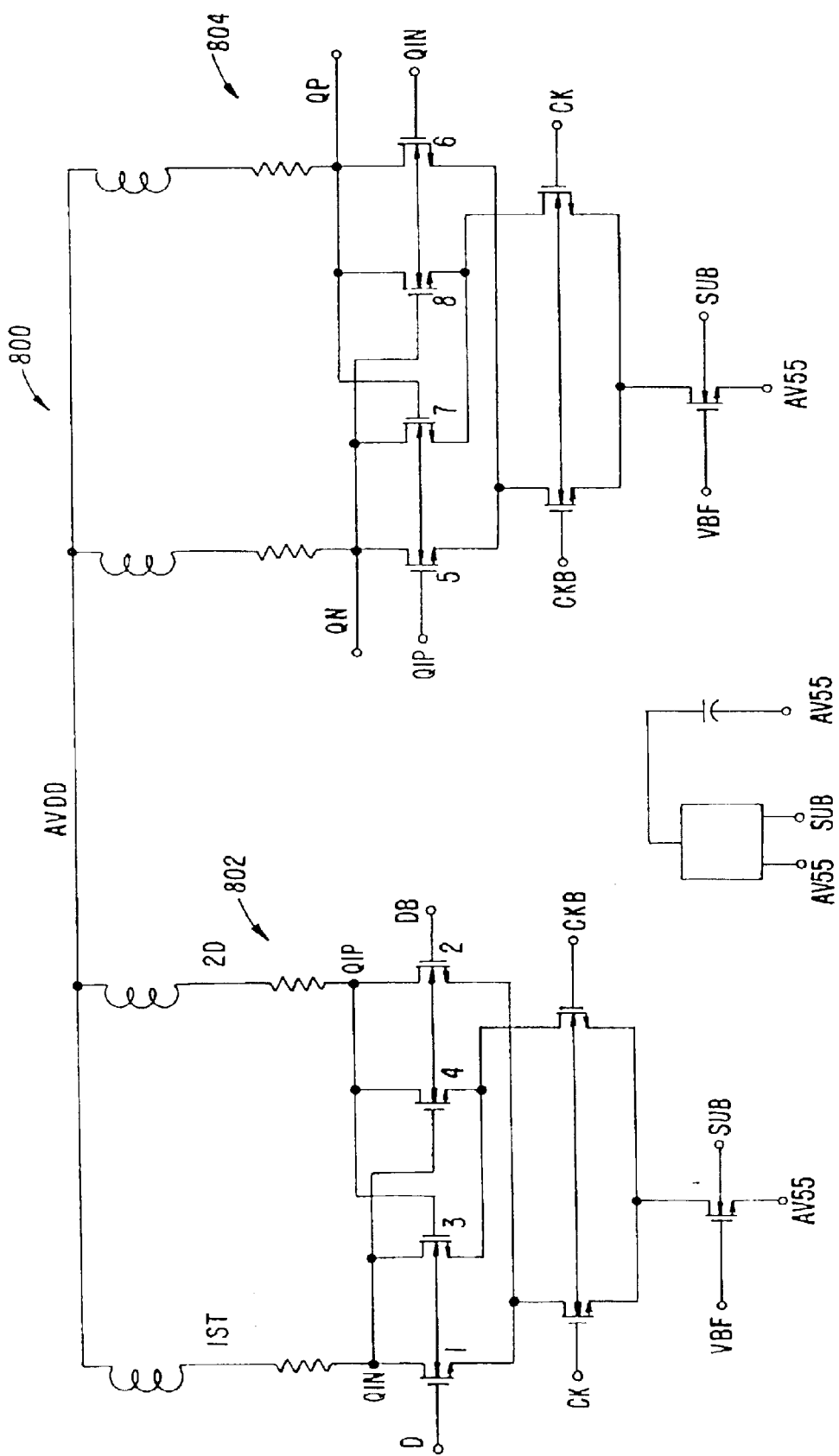
FIG. 8 is a circuit diagram of a flip-flop utilizing features of the invention.

FIG. 8 shows an exemplary implementation of a C³MOS flip flop with inductive broadbanding for use as the re-timing flip flop in the serializer of FIG. 5. A C³MOS master-slave flip-flop 800 according to the present invention can be made by combining two latches 802 and 804. A first latch 802 receives differential input signals D and $\overline{D}$ and generates differential output signals QI and $\overline{QI}$. The differential output signals QI and $\overline{QI}$ are then applied to the differential inputs of a second latch 804. The differential outputs Q and $\overline{Q}$ of second latch 804 provide the outputs of flip-flop 800. The input transistors of each latch are coupled to VDD by a resistor and shunt inductor coupled in series.

It is to be understood that all C³MOS logic elements, numerous examples of which are described on the above-referenced commonly-assigned patent application, can employ the inductive broadbanding technique according to the present invention.

Figure 9:
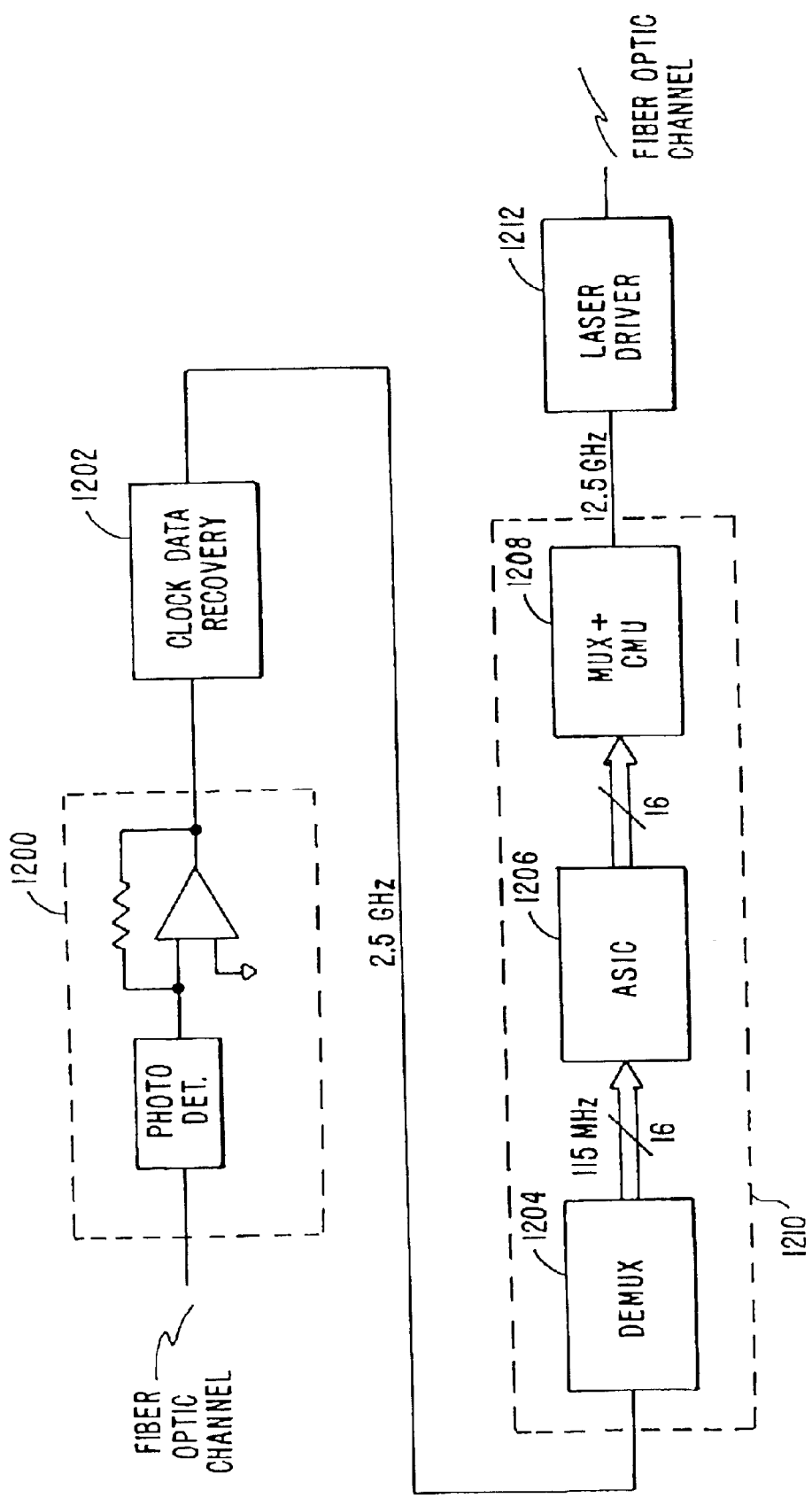
FIG. 9 is a simplified block diagram of a transceiver system that utilizes the C³MOS with inductive broadbanding /C³MOS /CMOS combined logic according to the present invention to facilitate interconnecting high speed fiber optic communication channels.

According to one embodiment of the present invention the combined C³MOS with inductive broadbanding /C³MOS /CMOS circuit technique is employed in a transceiver of the type illustrated in FIG. 9. The exemplary transceiver of FIG. 9 is typically found along fiber optic channels in high speed telecommunication networks. The transceiver includes at its input a photo detect and driver circuit 1200 that receives the input signal from the fiber optic channel. Circuit 1200 converts fiber-optic signal to packets of data and supplies it to a clock data recovery (CDR) circuit 1202. CDR circuit 1202 recovers the clock and data signals that may be in the frequency range of about 10 GHz, or higher. Established telecommunication standards require the transceiver to perform various functions, including data monitoring and error correction. These functions are performed at a lower frequency. Thus, the transceiver uses a demultiplexer 1204, depicted in FIGS. 5 and 6, which deserializes the 10 Gb/s data stream into, for example, 16 parallel signals having a bit rate of about 622 Mb/s. An application specific integrated circuit (ASIC) 1206 then performs the monitoring and error correction functions at the lower (622 Mb/s) bit rate. A multiplexer and clock multiplication unit (CMU) 1208 converts the parallel signals back into a single bit stream at 10 Gb/s. This signal is then retransmitted back onto the fiber optic channel by a laser drive 1212. The combined C³MOS with inductive broadbanding /C³MOS /CMOS technique of the present invention allows fabrication of demultiplexer 1204, ASIC 1206 and multiplexer and CMU 1208 on a single silicon die. That is, demultiplexer 1204 and multiplexer and CMU 1208 are implemented in C³MOS with inductive broadbanding /C³MOS with ASIC 1206 implemented in conventional CMOS.

In conclusion, the present invention provides various circuit techniques for implementing ultra high speed circuits using current-controlled CMOS (C³MOS) logic and C³MOS with inductive broadbanding logic fabricated in conventional CMOS process technology. In one embodiment, the present invention advantageously combines high speed C³MOS with inductive broadbanding /C³MOS with inductive broadbanding /C³MOS logic with low power conventional CMOS logic. According to this embodiment circuits such as transceivers along fiber optic channels can be fabricated on a single chip where the ultra-high speed portions of the circuit utilize C³MOS with inductive broadbanding /C³MOS and the relatively lower speed parts of the circuit use conventional CMOS logic.

While the above is a complete description of the preferred embodiment of the present invention, it is possible to use various alternatives, modifications and equivalents. For example, although spiral inductors and poly resistors are utilized in the preferred embodiment other techniques known to persons of skill in the art can be utilized Therefore, the scope of the present invention should be determined not with reference to the above description but should, instead, be determined with reference to the appended claims, along with their full scope of equivalents.

What is claimed is:

1. A circuitry fabricated on a silicon substrate, the circuitry comprising:
    a deserializer, implemented using current-controlled complementary metal-oxide semiconductor (C³MOS) logic with inductive broadbanding, that receives an input signal having a first frequency and generates a first plurality of signals there from such that each signal of the first plurality of signals has a second frequency that is lower than the first frequency;
    core circuitry, implemented using conventional complementary metal-oxide-semiconductor (CMOS) logic, that is communicatively coupled to the deserializer and that processes each signal of the first plurality of signals having the second frequency thereby generating a second plurality of signals such that each signal of the second plurality of signals also has the second frequency; and
    a serializer, implemented using C³MOS logic with inductive broadbanding, that is communicatively coupled to the core circuitry and that receives each signal of the second plurality of signals and that generates an output signal there from that has the first frequency.

2. The circuitry of claim 1, wherein:
    at least one of the serializer and the deserializer is implemented using first and second n-channel metal-oxide-semiconductor field-effect transistor (MOSFET) having their source terminals coupled to a first node, their gate terminals coupled to receive a first and second differential logic signals, respectively, and their drain terminals coupled respectively to first and second output nodes;
    first and second series RL circuits respectively coupled between the first and second output nodes and a logic high level;
    first and second capacitive loads ($C_L$) respectively coupled to the output nodes; and
    a current-source n-channel MOSFET coupled between the source terminals to the first and second n-channel MOSFETs and a logic low level.

3. The circuitry of claim 2, wherein:
    each RL circuit of the first and second series RL circuits includes a resistor and an inductor connected in series; and
    the inductor of each RL circuit of the first and second series RL circuits is a spiral inductor coupled to the silicon substrate.

4. The circuitry of claim 2, wherein;
    each RL circuit of the first and second series RL circuits includes a resistor and an inductor connected in series; and
    the resistor of each RL circuit of the first and second series RL circuits is a p-channel MOSFET that operates substantially in its linear operating region.

5. The circuitry of claim 2, wherein:
    each RL circuit of the first and second series RL circuits includes a resistor and an inductor connected in series; and
    the resistor of each RL circuit of the first and second series RL circuits is a polysilicon resistor fabricated of polysilicon materials.

6. The circuitry of claim 1, wherein:
    the core circuitry performs monitoring and error correction of each signal of the first plurality of signals having the second frequency.

7. The circuitry of claim 6, wherein:
    the core circuitry is implemented as an application specification integrated circuit (ASIC).

8. The circuitry of claim 1, further comprising:
    a laser driver circuitry, communicatively coupled to the serializer, that receives the output signal having the first frequency, that converts the output signal from an electrical signal format to a fiber-optic signal having an optical signal format compatible with a fiber-optic communication channel, and transmits the fiber-optic signal onto the fiber-optic communication channel.

9. The circuitry of claim 1, further comprising:
    a photo detect and driver circuitry, communicatively coupled to a fiber optic communication channel, that receives a fiber-optic signal there from and that converts the fiber-optic signal to a channel signal having an electrical signal format that is arranged into a plurality of data packets; and
    a clock data recovery (CDR) circuitry, communicatively coupled to the photo detect and driver circuitry, that receives the channel signal and that recovers a clock and a data signal there from.

10. A circuitry fabricated on a silicon substrate, the circuitry comprising:
    a deserializer, implemented using current-controlled complementary metal-oxide semiconductor (C³MOS) logic with inductive broadbanding, that receives an input signal having a frequency and generates a plurality of signals there from such that each signal of the plurality of signals has a second frequency that is lower than the first frequency;
    wherein the deserializer is implemented using first and second n-channel metal-oxide-semiconductor field-effect transistor (MOSFET) having their source terminals coupled to a first node, their gate terminals coupled to receive a first and second differential logic signals, respectively, and their drain terminals coupled respectively to first and second output nodes;
    first and second series RL circuits respectively coupled between the first and second output nodes and a logic high level;

first and second capacitive loads ($C_L$) respectively coupled to the output nodes; and a current-source n-channel MOSFET coupled between the source terminals to the first and second n-channel MOSFETs and a logic low level.

11. The circuitry of claim 10, further comprising:

core circuitry, implemented using conventional complementary metal-oxide-semiconductor (CMOS) logic, that is communicatively coupled to the deserializer and that processes each signal of the plurality of signals having the second frequency thereby generating a processed plurality of signals such that each signal of the processed plurality of signals also has the second frequency; and a serializer, implemented using C$^3$MOS logic with inductive broadbanding, that is communicatively coupled to the core circuitry and that receives each signal of the processed plurality of signals and that generates an output signal there from that has the first frequency.

12. The circuitry of claim 11, further comprising:

a laser driver circuitry, communicatively coupled to the serializer, that receives the output signal having the first frequency, that converts the output signal from an electrical signal format to a fiber-optic signal having an optical signal format compatible with a fiber-optic communication channel, and transmits the fiber-optic signal onto the fiber-optic communication channel.

13. The circuitry of claim 11, further comprising:

a photo detect and driver circuitry, communicatively coupled to a fiber optic communication channel, that receives a fiber-optic signal there from and that converts the fiber-optic signal to a channel signal having an electrical signal format that is arranged into a plurality of data packets; and a clock data recovery (CDR) circuitry, communicatively coupled to the photo detect and driver circuitry, that receives the plurality of data packets of the channel signal and that recovers a clock and a data signal there from.

14. The circuitry of claim 10, wherein:

each RL circuit of the first and second series RL circuits includes a resistor and an inductor connected in series; and the inductor of each RL circuit of the first and second series RL circuits is a spiral inductor coupled to the silicon substrate.

15. The circuitry of claim 10, wherein:

each RL circuit of the first and second series RL circuits includes a resistor and an inductor connected in series; and the resistor of each RL circuit of the first and second series RL circuits is a p-channel MOSFET that operates substantially in its linear operating region.

16. The circuitry of claim 10, wherein: each RL circuit of the first and second series RL circuits includes a resistor and an inductor connected in series; and the resistor of each RL circuit of the first and second series RL circuits is a polysilicon resistor fabricated of polysilicon materials.

17. The circuitry of claim 10, wherein:

the core circuitry performs monitoring and error correction of each signal of the first plurality of signals having the second frequency.

18. The circuitry of claim 17, wherein:

the core circuitry is implemented as an application specification integrated circuit (ASIC).

19. A transceiver, comprising:

a photo detect and driver circuitry, communicatively coupled to a fiber optic communication channel, that receives an input fiber-optic signal there from and that converts the input fiber-optic signal to a channel signal having an electrical signal format that is arranged into a plurality of data packets;

a clock data recovery (CDR) circuitry, communicatively coupled to the photo detect and driver circuitry, that receives the plurality of data packets of the channel signal and that recovers a clock and an input data signal there from;

a deserializer, implemented using current-controlled complementary metal-oxide semiconductor (C$^3$MOS) logic with inductive broadbanding, that receives the input data signal having a first frequency and generates a first plurality of signals there from such that each signal of the first plurality of signals has a second frequency that is lower than the first frequency;

core circuitry, implemented using conventional complementary metal-oxide-semiconductor (CMOS) logic, that is communicatively coupled to the deserializer and that processes each signal of the first plurality of signals having the second frequency thereby generating a second plurality of signals such that each signal of the second plurality of signals also has the second frequency;

a serializer, implemented using C$^3$MOS logic with inductive broadbanding, that is communicatively coupled to the core circuitry and that receives each signal of the second plurality of signals and that generates an output data signal there from that has the first frequency; and a laser driver circuitry, communicatively coupled to the serializer, that receives the output data signal having the first frequency, that converts the output data signal from an electrical signal format to an output fiber-optic signal having an optical signal format compatible with the fiber-optic communication channel, and transmits the output fiber-optic signal onto the fiber-optic communication channel.

20. The circuitry of claim 19, wherein:

at least one of the serializer and the deserializer is implemented using first and second n-channel metal-oxide-semiconductor field-effect transistor (MOSFET) having their source terminals coupled to a first node, their gate terminals coupled to receive a first and second differential logic signals, respectively, and their drain terminals coupled respectively to first and second output nodes;

first and second series RL circuits respectively coupled between the first and second output nodes and a logic high level;

first and second capacitive loads ($C_L$) respectively coupled to the output nodes; and a current-source n-channel MOSFET coupled between the source terminals to the first and second n-channel MOSFETs and a logic low level.

* * * * *

UNITED STATES PATENT AND TRADEMARK OFFICE
CERTIFICATE OF CORRECTION

PATENT NO. : 6,909,309 B2  Page 1 of 1
APPLICATION NO. : 10/315473
DATED : June 21, 2005
INVENTOR(S) : Michael M. Green It is certified that error appears in the above-identified patent and that said Letters Patent is hereby corrected as shown below:

Column 1, line 7: after "continuation of" insert --U.S. patent application Ser. No. 09/965,235, filed September 26, 2001, now U.S. Pat. No. 6,525,571, which is a continuation of U.S. patent application Ser. No. 09/610,905, filed July 6, 2000, now U.S. Pat. No. 6,340,899,--

Signed and Sealed this

Fifth Day of August, 2008

JON W. DUDAS
*Director of the United States Patent and Trademark Office*